United States Patent
Hynecek et al.

(10) Patent No.: US 7,541,627 B2
(45) Date of Patent: Jun. 2, 2009

(54) METHOD AND APPARATUS FOR IMPROVING SENSITIVITY IN VERTICAL COLOR CMOS IMAGE SENSORS

(75) Inventors: Jaroslav Hynecek, Allen, TX (US); Richard B. Merrill, Woodside, CA (US); Russel A. Martin, Menlo Park, CA (US)

(73) Assignee: Foveon, Inc., San Jose, CA (US)

( * ) Notice: Subject to any disclaimer, the term of this patent is extended or adjusted under 35 U.S.C. 154(b) by 489 days.

(21) Appl. No.: 10/796,763

(22) Filed: Mar. 8, 2004

(65) Prior Publication Data

US 2005/0194653 A1 Sep. 8, 2005

(51) Int. Cl.
*H01L 29/768* (2006.01)
(52) U.S. Cl. .................. 257/224; 257/389; 257/392; 257/393; 257/394; 257/395; 257/398; 257/399; 257/400; 257/E27.131; 257/E27.132; 257/E27.134; 257/E27.135
(58) Field of Classification Search ................ 257/242, 257/389, 392–395, 398–400, 224
See application file for complete search history.

(56) References Cited

U.S. PATENT DOCUMENTS

| 4,229,752 A | 10/1980 | Hynecek | 357/24 |
|---|---|---|---|
| 4,266,234 A | 5/1981 | Hornbeck et al. | 357/24 |
| 4,271,419 A | 6/1981 | Hornbeck | 357/24 |
| 4,277,792 A | 7/1981 | Hornbeck | 357/24 |
| 4,484,210 A | 11/1984 | Shiraki et al. | 357/24 |
| 4,845,548 A | 7/1989 | Kohno et al. | 358/47 |
| 5,162,887 A | 11/1992 | Dierschke | 257/465 |
| 5,625,210 A | 4/1997 | Lee et al. | 257/292 |
| 6,051,447 A | 4/2000 | Lee et al. | 438/48 |
| 6,727,521 B2 * | 4/2004 | Merrill | 257/98 |
| 6,930,336 B1 * | 8/2005 | Merrill | 257/292 |
| 7,110,028 B1 * | 9/2006 | Merrill | 348/294 |
| 2002/0058353 A1 | 5/2002 | Merrill | 438/57 |
| 2004/0178466 A1* | 9/2004 | Merrill et al. | 257/440 |

FOREIGN PATENT DOCUMENTS

| EP | 1 109 229 A2 | 6/2001 |
|---|---|---|
| WO | WO 96/13865 | 5/1996 |

* cited by examiner

*Primary Examiner*—A. Sefer
(74) *Attorney, Agent, or Firm*—Lewis and Roca LLP

(57) ABSTRACT

The invention describes in detail the structure of a CMOS image sensor pixel that senses color of impinging light without having absorbing filters placed on its surface. The color sensing is accomplished by having a vertical stack of three-charge detection nodes placed in the silicon bulk, which collect electrons depending on the depth of their generation. The small charge detection node capacitance and thus high sensitivity with low noise is achieved by using fully depleted, potential well forming, buried layers instead of undepleted junction electrodes. Two embodiments of contacting the buried layers without substantially increasing the node capacitances are presented.

9 Claims, 7 Drawing Sheets

METHOD AND APPARATUS FOR IMPROVING SENSITIVITY IN VERTICAL COLOR CMOS IMAGE SENSORS

BACKGROUND OF THE INVENTION

1. Field of the Invention

The present invention relates to solid-state image sensors and specifically to a class of CMOS image sensors with multiple charge detection nodes placed at various depths in the substrate to selectively detect light of different wavelengths. Sensors that use such pixels do not require wavelength selective filters to detect colors, and thus do not sacrifice Quantum Efficiency (QE) and resolution.

2. Description of the Related Art Including Information Disclosed Under 37 CFR 1.97 and 1.98

A typical image sensor detects light by converting impinging photons into electrons that are integrated (collected) in pixels of the image sensing area. After completing integration, collected charge is converted into a voltage using a suitable charge-to-voltage conversion structure. The sensed voltage is then supplied through various addressing circuitry and buffering amplifiers to the output terminals of the sensor. Placing various wavelength selective filters on top of the pixels allows only a chosen portion of the light spectrum to enter the pixel and generate charge. The description of the conventional concept of color sensing may be found for example in U.S. Pat. No. 4,845,548 to Kohno. However, this concept reduces detected light levels as well as array resolution, since a single pixel can sense only one color while rejecting other colors. Recently a new class of devices has been developed, called VERTICOLOR Image Sensors, as described for example in U.S. patent 2002/0058353A1 to Merrill. These devices use a pixel structure with multiple vertically stacked charge detection nodes that detect color by measuring charge generated at different depths within the pixel. Since light of different wavelengths penetrates to different depths in the substrate, color is sensed directly within one pixel without the necessity of surface wavelength selective filters. This is one advantage of the VERTICOLOR concept and technology. One problem with placing multiple charge detection nodes vertically within a pixel is the large capacitance associated with each charge detection node that reduces the node conversion gain and thus the sensor sensitivity.

FIG. 1 illustrates a simplified cross section of pixel 100, which is from a prior art CMOS image sensor. On p+ type doped silicon substrate 101 there is p type doped region 102, which may be epitaxially grown, that extends all the way to the surface. P type doped region 102 contains vertically stacked n type doped layers 103, 104 and 105. These layers can be formed, for example, by ion implantation between consecutive epitaxial growth steps, or by other means. Various techniques are well known to those skilled in the art of modern silicon device fabrication processing technology and the descriptions here in are not meant to be limiting.

Similarly, n+ type doped vertical extensions (plugs) 106, 107, and 108 may be formed by ion implantation between epitaxial growth steps and serve as conductive connections that enable biasing and collection of photo-generated electrons in doped layers 103, 104 and 105 from the surface of the silicon substrate.

Plugs 106, 107 and 108 are contacted by metal regions 111, 112, and 113, which can be formed through holes in silicon-dioxide dielectric layer 110 or as multilevel interconnects over many types of dielectric layers, as is also well know in the art. Metal regions 111, 112, and 113 can be formed by a single metal, such as aluminum, or composed of complex metallization systems formed by various layers of titanium-nitride, titanium, tungsten, aluminum, cooper, and so on. Metal regions 111, 112, and 113 are then interconnected with various circuit components by metal wiring 114 that is, for simplicity, shown in the drawing only schematically.

To prevent parasitic surface channel conduction and shorting together of plugs 106, 107 and 108, p+ type doped isolation regions (channel stops) 109 are inserted between each of plugs 106, 107 and 108. Typically, channel stops 109 completely surround each of corresponding plugs 106, 107 and 108 in the direction that is perpendicular to the plane of drawing, which is not visible in FIG. 1.

One example of a typical circuit that can be used for detecting charge in the particular n+ type diffusion node is shown as a schematic in FIG. 1. The circuit consists of reset transistor 117 that connects charge detection node 115 to reference voltage terminal 119 when a suitable reset level is applied to gate 118. Photo-generated charge accumulating on node 115 causes a voltage charge that is buffered by transistor 116 with its drain connected to Vdd bias terminal 120. The output signal then appears on node 121 and can be further processed either as a voltage or as a current when supplied to the rest of the sensor circuitry. Circuit ground 122 is identical to p+ type doped substrate 101. For a single pixel that senses three colors, each color has a circuit including reset transistor 117 and amplifier transistor 116, connected as shown in FIG. 1. It would be apparent to those skilled in the art that other, more complex circuits can be connected to pixel 100.

When a reset voltage is applied to node 115 and the corresponding two remaining nodes (circuits connected to plugs 106 and 107, not shown), the potential of these nodes is raised to the reference bias level Vrf. When the doping level of layer 103 (as well as layers 104 and 105) is sufficiently high, the potential at node 115, the potential of plug 108 (as well as plugs 107 and 106), and the potential of layer 103 (as well as layers 104 and 105) are approximately the same. Layer 103 and plug 108, which are buried reverse biased diodes, act as a single electrode of a junction capacitor. The capacitance of such a structure is higher relative to the desired capacitance of pixel 100, since the junction area surrounding layer 103 on all sides is large. Combined with the input gate capacitance of the circuit connected to the node 115, the charge conversion factor of the node is small. As a result, the pixel has low sensitivity, which is undesirable in a sensor. What is needed is a vertically structured pixel with reduced capacitance.

BRIEF SUMMARY OF THE INVENTION

The invention provides a vertical multi-detection node structure that senses charge according to its depth of generation and has low charge detection node capacitance.

Incorporating a fully depleted vertical stack of potential wells that are connected to small charge detection nodes by suitable charge carrying channels accomplishes this task and other objects of the invention.

DETAILED DESCRIPTION OF THE INVENTION

Figure 1:
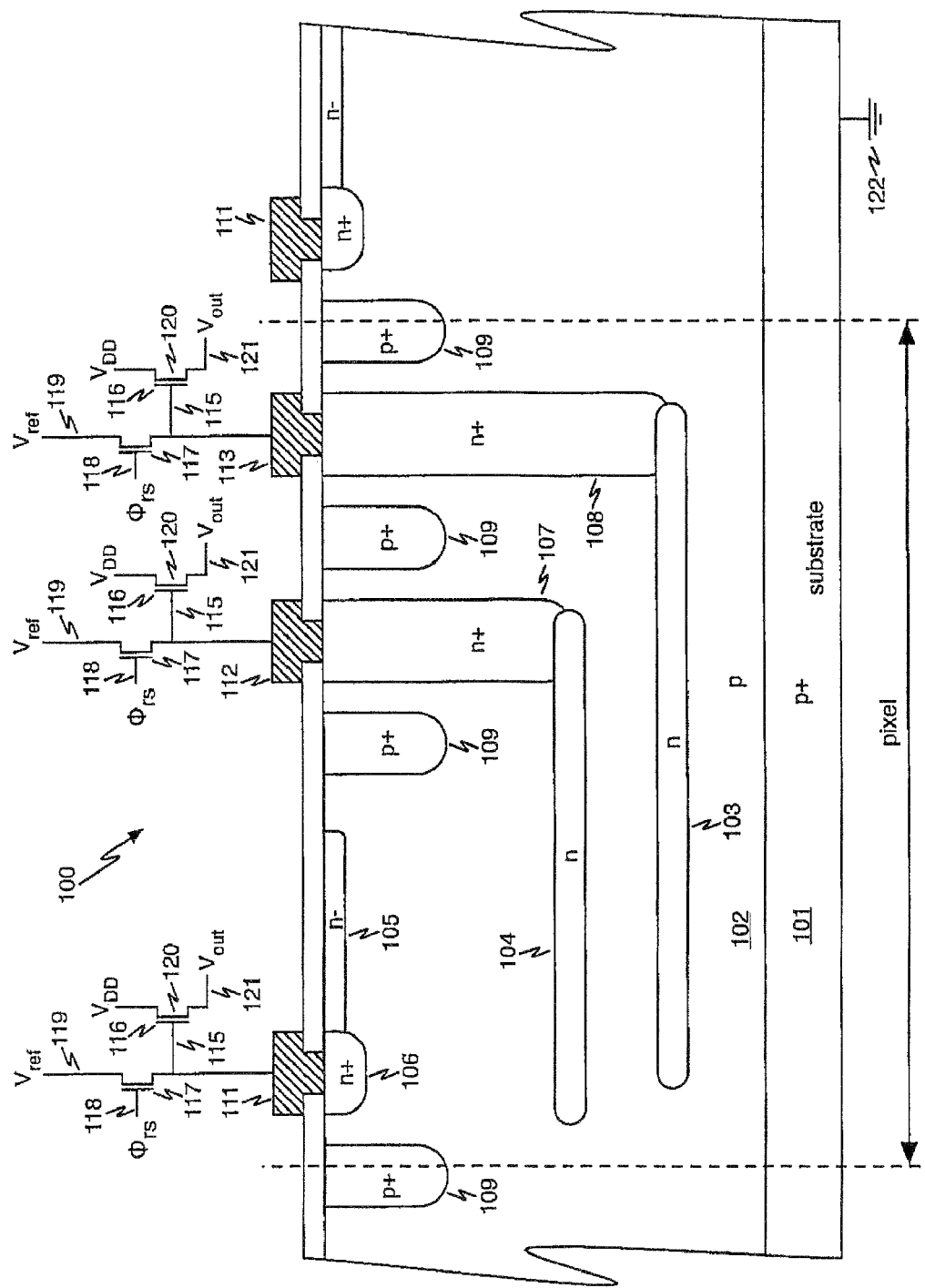
FIG. 1 is a prior art diagram illustrating a simplified pixel that has three n type diode charge detection nodes placed above each other within the p type substrate.
Figure 2:
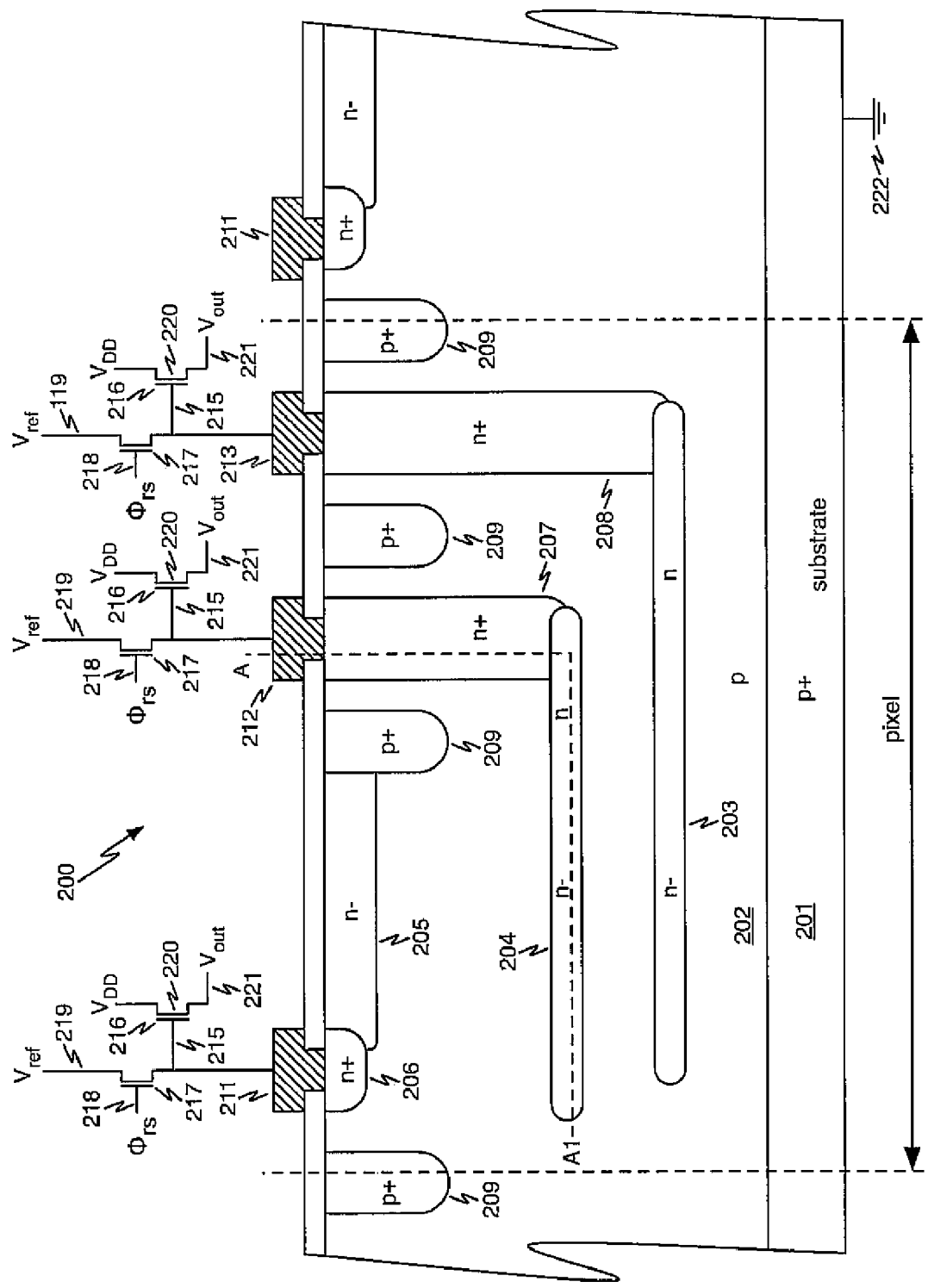
FIG. 2 is a diagram illustrating one embodiment of the invention that has three fully depleted n− type layers of various doping concentration placed above each other within the p type substrate to form a single pixel.

FIG. 2 is a diagram illustrating one embodiment of the invention that has three fully depleted n− type layers of various doping concentration placed above each other within the p type substrate to form a single pixel. Pixel 200 has p+ type substrate 201. P type doped region 202 was, for example, epitaxially deposited on substrate 201. Region 202 contains vertically stacked n type doped regions 203, 204 and 205 corresponding to regions 103, 104, and 105 in FIG. 1. However, these regions now are only lightly doped such that they are depleted during normal operation of the pixel.

Extensions 223 and 224 are horizontal extensions of regions 203 and 204, respectively that have a slightly higher doping. The main reason for adding these extensions is to ensure a connection from the depletable regions 203 and 204 to plugs 208 and 207. The doping levels of extensions 223 and 224 are such that they do not deplete out during normal operation of the pixel.

In contrast to region 105 in FIG. 1, p+ type doped surface region 225 forms region 205 that is surrounded by p type material much like regions 203 and 204. This causes region 205 to have similar operating characteristics to regions 203 & 204. Another advantage gained by region 225 is quenching of surface generated dark current by p+ type doping at the silicon-silicon dioxide interface. This portion of the structure is similar to pinned photodiode U.S. Pat. No. 4,484,210 to Teranisihi or Virtual Phase CCD gate electrode U.S. Pat. No. 4,229,752 to Hynecek, both incorporated by reference herein.

When driven to sufficiently high voltage, regions 203, 204, and 205 do not form conductive electrodes of a detection node capacitor, rather, they form depleted potential wells. When charge is generated in region 202 at various depths it diffuses first vertically to one of regions 203, 204, and 205, and then laterally within these regions to corresponding plugs 208, 207, and 206.

When node 215 is reset to a sufficiently high voltage, only the potential of node 215 and corresponding plug 208 changes. The potential of region 203 and extension 224 remains relatively constant and does not change significantly during reset of the pixel. Capacitance of node 215, therefore, consists of the capacitance of plug 208 and the input capacitance of the circuit at node 215. These capacitances can be minimized by appropriate sizing of transistors and structures and in addition do not depend on the size of the regions 203, 204, and 205, and extensions 223 and 224 and thus do not depend on the size of the pixel. Reduced capacitance contributes to higher pixel sensitivity and lower noise. In addition, the depletion of the photo charge collecting regions 203, 204 and 205 enables a partial charge transfer action as is shown in the prior art.

The remainder of pixel 200 operates in a manner similar to pixel 100. Oxide dielectric layer 210, channel stops 209, metal contacts 211, 212, and 213, together with wiring 214 serve the same purpose in pixel 200 as in pixel 100. Also, pixel 200 is the same with reset and buffer transistors 217 and 216 respectively, reset gate terminal 218, reference voltage terminal 219, Vdd bias terminal 220, and output terminal 221 shown connected to each of plugs 206, 207, and 208. The circuit ground is terminal 222.

The metal interconnects and various circuit elements that also belong to pixel 200 are for simplicity shown only schematically and some elements are completely omitted. For example, only the schematic components connected to plug 208 are illustrated, for simplicity.

Figure 3:
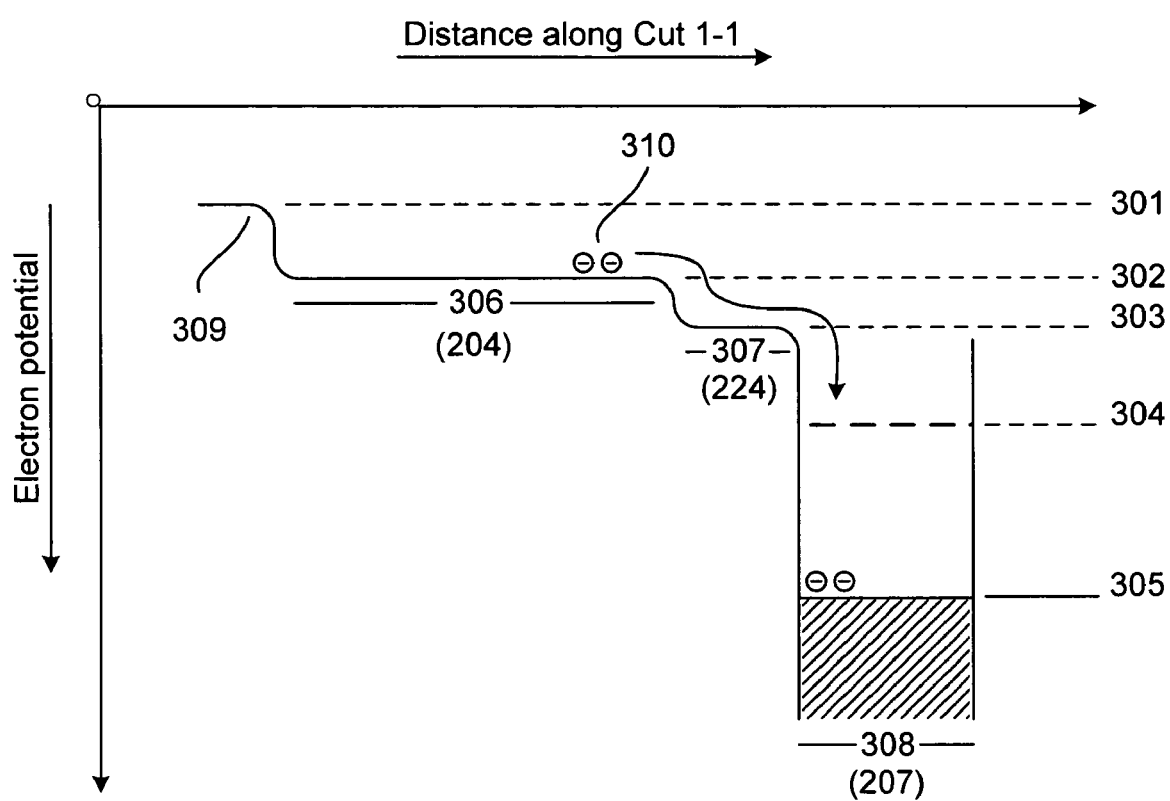
FIG. 3 is a graph illustrating a charge potential profile within the pixel of FIG. 2 taken along line A'-A. The graph shows the potential of regions that have different doping concentrations. The collection and flow of photo-generated electrons is also shown in this drawing.

FIG. 3 is a graph illustrating a charge potential profile within the pixel of FIG. 2 taken along line A'-A. In FIG. 3, the x-axis represents a position along line A'-A from FIG. 2 and the y-axis represents the electron potential (direction down is positive potential representing lower electron energy). Section 309 represents potential level 301 of the substrate that can for convenience be set equal to zero. Section 306 represents the potential of region 204 in FIG. 2 at a potential of 302. Section 307 represents the potential of extension 224 and plug 207 at a potential of 303. As charge 310 is generated in the pixel, it is first collected in the well at potential level 302 and drifts through levels 303 and 304 to level 305 into detection node section 308. Detection node section 308 was previously reset to level 305.

As more charge accumulates at node 308, its potential is lowered to level 304; these levels are sensed by transistor 216. In one embodiment, region 204 is doped in such a manner so that all or substantially all of the charge will collect at node 308. This is accomplished by having the voltage level 302 "pinned" at a particular voltage by depleting out and having it's capacitance go to zero. Charge will then drift towards the higher potential of region 224 and then plug 207. Consequently, a pixel using the invention has higher sensitivity.

In another embodiment, the charge potential profile is designed such that when more charge accumulates, at a certain level, for example, level 303 in graph 300, charge is stored in region 307 and eventually also in region 306. In this case regions 224 and 204 begin in a fully depleted state. As they collect charge they come out of depletion and develop capacitance. The increased capacitance in regions 224 and 204 decreases the electron to voltage conversion (because of increase in capacitance). This changes the sensitivity of the pixel to charge collection and thereby extends the dynamic range of the pixel.

Figure 4:
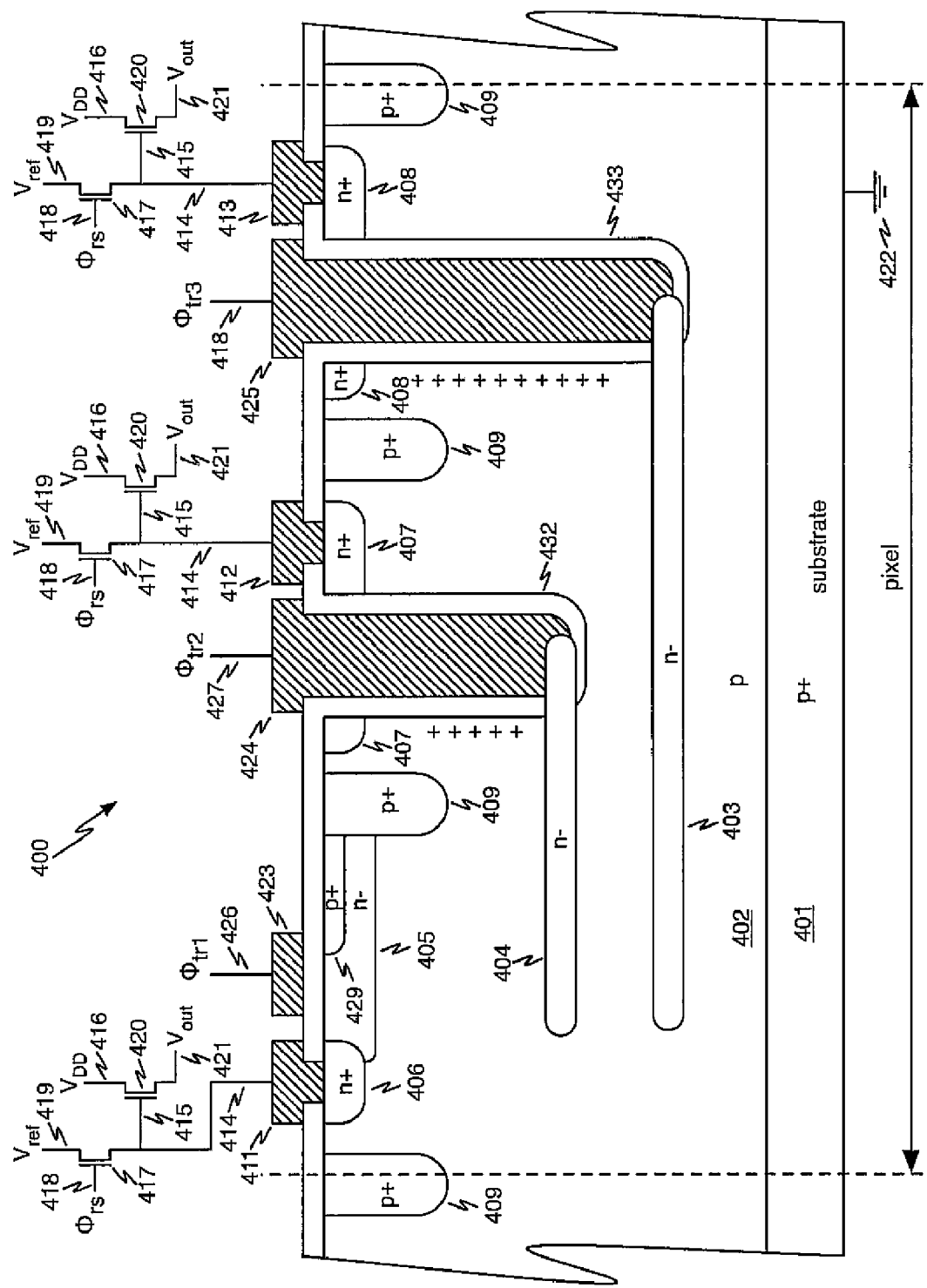
FIG. 4 is a diagram illustrating another embodiment of the invention that has three fully depleted n− type doped layers placed above each other within the p type substrate to form a single pixel.

FIG. 4 is a diagram illustrating another embodiment of the invention that has three fully depleted n− type doped layers placed above each other within the p type substrate to from a single pixel. In pixel 400, vertical plugs 207 and 208 from pixel 200 in FIG. 2 have been eliminated and replaced by vertical trench transistors. This reduces the detection node capacitance even further, since after the vertical transistors are turned off, only n+ type junction regions 406, 407, and 408 remain connected to the circuit, which in the right process will have lower capacitance than the plugs 207 and 208.

P+ type substrate 401 has p type doped region 402 epitaxially deposited on it. Region 402 contains vertically stacked n-type doped regions 403, 404, and 405 that are under normal operating conditions completely depleted of charge. Regions 403 and 404 extend laterally to trench holes 433 and 432. It is also possible to include similar lateral extension as 223 and 224 in FIG. 2 in this structure, but this has been omitted from the drawing for simplicity. Trench holes 432 and 433 have gate oxide grown on their walls and bottom. The oxide layer can have a similar thickness as oxide layer 410 or have a different thickness.

It is also possible to place doping impurities 430 and 431 on selected walls of trench holes 432 and 433, respectively, by angled ion implantation process. This will reduce the size of the channel that transfers charge from potential wells 403 and 404 to surface n+ type doped junctions 407 and 408 even further. A layer of poly-silicon forms gates 424 and 425 of vertical trench transistors. The gates are connected to terminals 427 and 428. When a suitable voltage is applied to these gates, photo-generated charge, which has accumulated in potential wells formed in regions 403 and 404, is transferred to junctions 407 and 408 for sensing. Because it is difficult to precisely align the depth of the trenches with the edges of doping regions 403 and 404, a small overlap will typically be used. The trench transistors are comprised of trench hole 433 and gate 425, and trench hole 432 and gate 424.

The remainder of the structure is similar to the previous example. P+ type doped channel stop regions 409 separate n+ type charge detection node junctions 406, 407, and 408 from each other. Detection node junctions 406, 407, and 408 are connected to metallization regions 411, 412, and 413 through contact holes opened in oxide dielectric layer 410. Wires 414 are used for interconnecting detection node junctions 406, 407 and 408 with the rest of the circuit components of pixel 400, such as the reset transistors 417 and the buffer transistors 416 shown in FIG. 4 connected to each of plugs 406, 407, and 408.

Applying a voltage to gate terminal 418 activates reset transistor 417, which electrically connects node 415 to reference terminal 419. An appropriate bias voltage, for example Vdd, is applied to terminal 420 and the output signal appears on node 421. Circuit ground 422 is connected to p+ type doped substrate 401. For the symmetry of the structure the pinned photodiode formed by regions 429 and 405 is connected to detection node 406 by a transistor. This transistor is, however, in a standard lateral buried channel configuration with gate 423 and gate terminal 426.

The metal interconnects and various circuit elements that also belong to the pixel are for simplicity shown only schematically and some are completely omitted.

Figure 5:
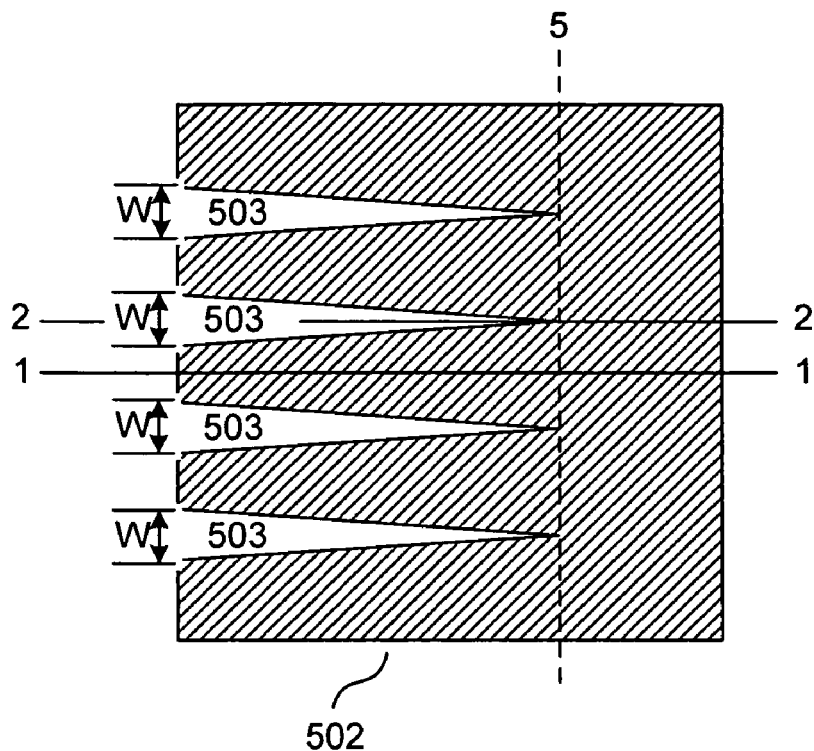
FIG. 5 is a diagram illustrating a basic pixel collector structure for a single photodiode that accomplishes a doping grading without having non-standard implant levels and directions.

FIG. 5 is a plan view illustrating another embodiment of a photodiode. Region 502 is a buried vertically stacked n type doped region, similar to regions 203, 204 and 205 of FIG. 2. Typically, excepting areas near an edge, doping concentration at a given depth is uniform. Therefore there is no field to drive collected charge to a contact, for example plug 208.

In order to achieve a lateral field to deliver collected charge to a contact, region 502 has vertically cut slits 503 with a width W. If the vertical thickness (in a plane perpendicular to the plane of FIG. 5) is greater than width W, then dopants will diffuse into the gaps and create a lateral gradient in doping concentration, with doping levels increasing (from left to right) along the length of region 502. Dopant concentration level is illustrated in FIG. 6.

Although FIG. 5 illustrates triangular slits, one of ordinary skill in the art will recognize that the slits may be manufactured in a narrowing step-wise fashion (not shown) or any other appropriate manner.

Figure 6:
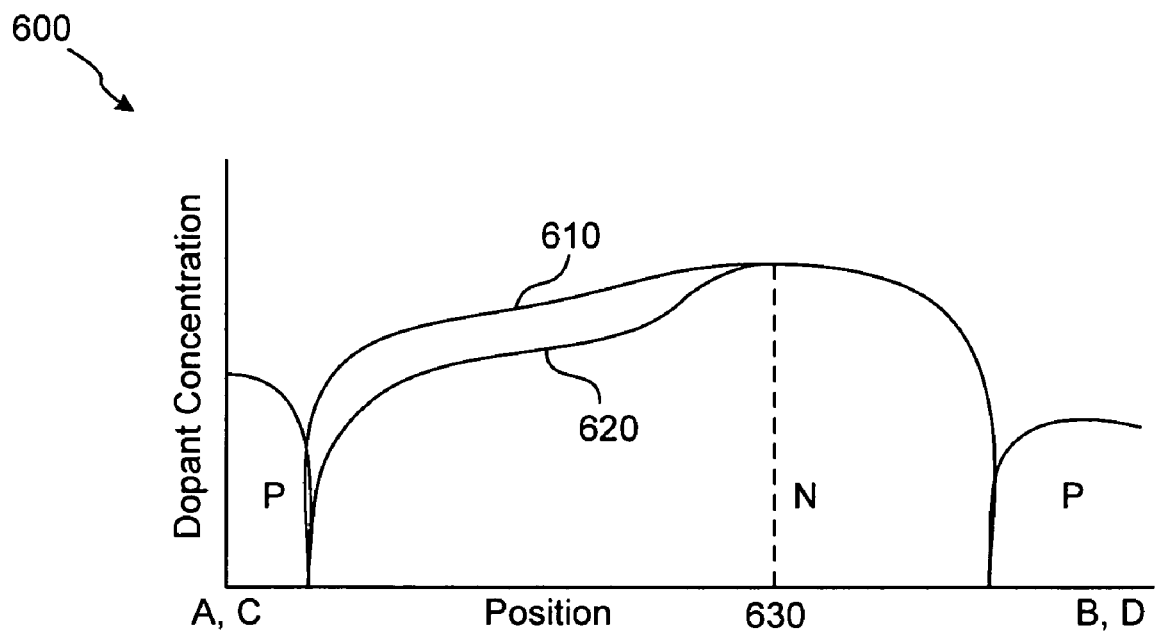
FIG. 6 is a graph illustrating dopant concentration levels relative to dopant position within the buried portion of a photodiode of FIG. 5.

FIG. 6 is a graph illustrating dopant concentration levels relative to region position within the buried portion of a photodiode of FIG. 5. The P regions of graph 600 represent substrate 202. Graph 600 shows dopant concentration on the X-axis and position on the Y-axis relative to position, from left to right, of region 502 in FIG. 5. Line 610 represents doping concentration along line 1'-1 of FIG. 5. Doping concentration increases somewhat, from left to right. Line 620 represents doping concentration along line 2'-2 of FIG. 5, where doping concentration increases more than line 2'-2, from left to right. At position 630 the doping concentrations are the same at line 5'-5 in FIG. 5, where slits 503 end. Dopant concentration along line 2'-2 will produce the lateral field to drive charge to the right, according to the example in FIG. 5. The number of slots 503 to include is limited only by the technology available to produce them.

Figure 7:
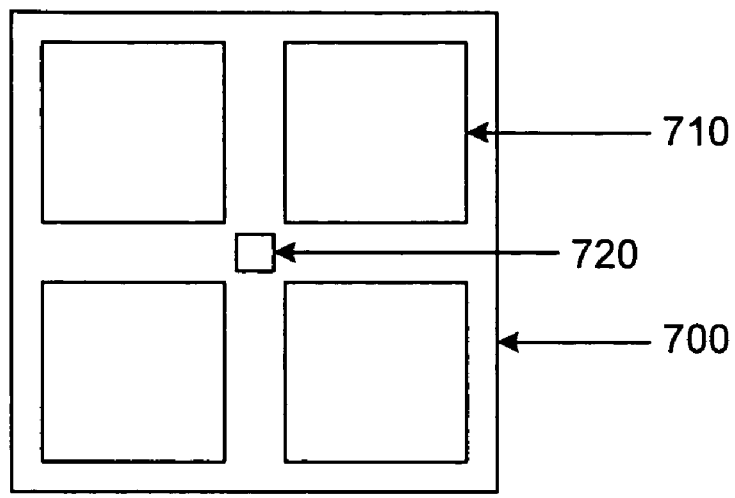
FIG. 7 is a diagram of another embodiment of the invention illustrating plug placement with respect to collector.

FIG. 7 is another embodiment of the invention illustrating plug placement with respect to collector. Red collector 700 is overlapped by green collector 710. The blue collector is not shown in FIG. 7 for simplicity. In one embodiment, plug 720 for red collector 700 is positioned in the center of the red collector, rather than to the side as illustrated in FIG. 2. Positioning of plug 720 at the center of red collector 700 allows collection at maximum potential, eliminating a separate layer to extend from the collector to the plug, for example extension 224 of FIG. 2.

Figure 8:
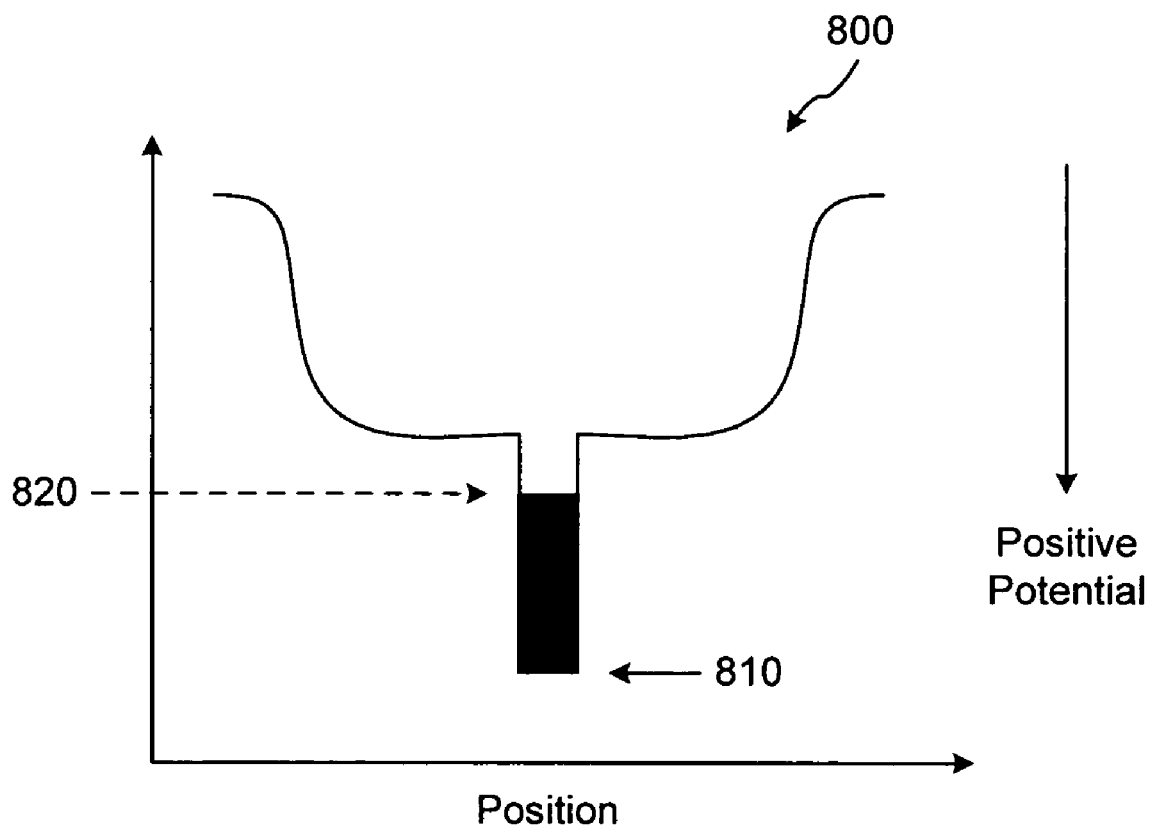
FIG. 8 is a graph of collector and plug potential for the plug and collector of FIG. 7.

FIG. 8 is a graph of an approximation of collector and plug potential for the plug and collector of FIG. 7. The Y-axis of graph 800 represents negative potential in the increasing Y direction. The X-axis of graph 800 represents position along red collector 700 of FIG. 7, with position 810 representing plug 720 and the low and high points on the X-axis representing the edges of red collector 700. Charge gathered by red collector 700 settles to the point of highest positive potential, which is at the lowest point on the Y-axis, in plug 720. Charge gathered at the edges of red collector 700 diffuses towards the lowest point, in plug 720, represented by position 810 in graph 800. Potential level 820 is an example of charge potential after integration.

Figure 9:
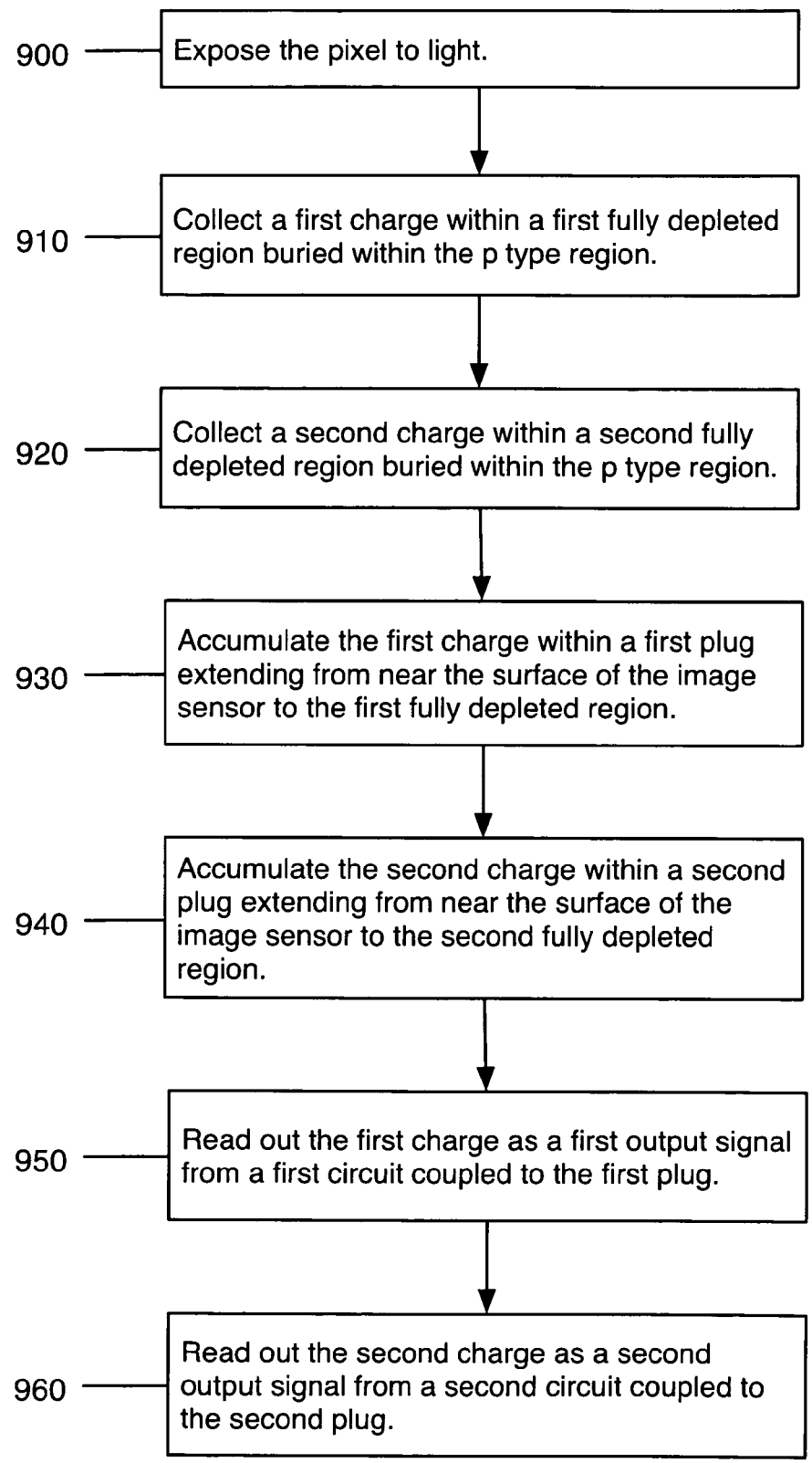
FIG. 9 is a flow diagram illustrating a method of collecting charge within a light-sensing pixel having a p type doped region in a CMOS image sensor.

FIG. 9 is a flow diagram illustrating a method of collecting charge within a light-sensing pixel having a p type doped region in a CMOS image sensor. In block 900, expose the pixel to light. In block 910, collect a first charge within a first fully depleted region buried within the p type region. In block 920, collect a second charge within a second fully depleted region buried within the p type region, wherein the second fully depleted region is vertically separated from the first fully depleted region. In block 930, accumulate the first charge within a first plug extending from the near the surface of the image sensor to the first fully depleted region. In block 940, accumulate the second charge within a second plug extending from the near the surface of the image sensor to the second fully depleted region. In block 950, read out the first charge as a first output signal from a first circuit coupled to the first plug. In block 960, read out the second charge as a second output signal from a second circuit coupled to the second plug.

Having described the invention, it is noted that persons skilled in the art can make modifications and variations in light of the above teachings. It is therefore to be understood that changes may be made in the particular embodiments of the inventions disclosed, which are within the scope and spirit of the inventions as defined by appended claims.

What is claimed is:

1. A light-sensing pixel, having a p type doped region, in a CMOS image sensor, comprising:
   a first doped charge collecting region buried within the p type doped region and configured to operate as a depleted potential well;
   a first n+ type doped plug extending from near the surface of the image sensor to the first charge collecting region;
   a second doped charge collecting region buried within the p type doped region, the second charge collecting region vertically separated from the first charge collecting region by the p type doped region and configured to operate as a depleted potential well;
   a second n+ type doped plug extending from near the surface of the image sensor to the second charge collecting region;
   a first extension with n+ type doping coupled to and between the first charge collecting region and the first plug, the first extension having a different doping concentration than the first charge collecting region; and
   a second extension with n+ type doping coupled to and between the second charge collecting region and the second plug, the second extension having a different doping concentration than the second charge collecting region.

2. The pixel of claim 1 wherein the first and second extensions are configured to operate such that they are not fully depleted of mobile charge.

3. The pixel of claim 1 further including:
   a first reset transistor having a source electrically coupled to the first n+ type doped plug, a drain coupled to a reference voltage, and a gate coupled to a reset signal line; and
   a second reset transistor having a source electrically coupled to the second n+ type doped plug, a drain coupled to a reference voltage, and a gate coupled to a reset signal line.

4. The pixel of claim 1 further including:
   a first amplifier transistor electrically coupled to the first n+ type doped plug, the first amplifier transistor having an output coupled to a first output node; and
   a second amplifier transistor electrically coupled to the second n+ type doped plug, the second amplifier transistor having an output coupled to a second output node.

5. The pixel of claim 4, wherein:
   the first amplifier transistor is a source follower amplifier having a gate coupled to the first n+ type doped plug, a drain coupled to a supply potential, and a source coupled the first output node; and
   the second amplifier transistor is a source follower amplifier having a gate coupled to the second n+ type doped plug, a drain coupled to a supply potential, and a source coupled the second output node.

6. The pixel of claim 1, further including:
   a third doped charge collecting region formed within the p type doped region and vertically separated from the first charge collecting region by the p type doped region, the third doped charge collecting region separated from an upper surface of the p type doped region by a p+ type surface region; and
   a third n+ type doped plug extending from near the surface of the image sensor to the third charge collecting region.

7. The pixel sensor of claim 6, further including:
   a first reset transistor having a source electrically coupled to the first n+ type doped plug, a drain coupled to a reference voltage, and a gate coupled to a reset signal line;
   a second reset transistor having a source electrically coupled to the second n+ type doped plug, a drain coupled to a reference voltage, and a gate coupled to a reset signal line; and
   a third reset transistor having a source electrically coupled to the third n+ type doped plug, a drain coupled to a reference voltage, and a gate coupled to a reset signal line.

8. The pixel of claim 6 further including:
   a first amplifier transistor electrically coupled to the first n+ type doped plug, the first amplifier transistor having an output coupled to a first output node;
   a second amplifier transistor electrically coupled to the second n+ type doped plug, the second amplifier transistor having an output coupled to a second output node;
   a third amplifier transistor electrically coupled to the third n+ type doped plug, the third amplifier transistor having an output coupled to a third output node.

9. The pixel of claim 8, wherein:
   the first amplifier transistor is a source follower amplifier having a gate coupled to the first n+ type doped plug, a drain coupled to a supply potential, and a source coupled the first output node;
   the second amplifier transistor is a source follower amplifier having a gate coupled to the second n+ type doped plug, a drain coupled to a supply potential, and a source coupled the second output node; and
   the third amplifier transistor is a source follower amplifier having a gate coupled to the third n+ type doped plug, a drain coupled to a supply potential, and a source coupled the third output node.

* * * * *